(12) United States Patent
Batruni

(10) Patent No.: US 8,369,809 B2
(45) Date of Patent: Feb. 5, 2013

(54) CREST FACTOR REDUCTION

(75) Inventor: Roy G. Batruni, Danville, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 1299 days.

(21) Appl. No.: 11/881,821

(22) Filed: Jul. 27, 2007

(65) Prior Publication Data

US 2009/0029664 A1    Jan. 29, 2009

(51) Int. Cl.
    *H04B 1/10* (2006.01)
(52) U.S. Cl. ............... 455/219; 455/114.2; 455/212
(58) Field of Classification Search .... 455/114.1–114.3, 455/115.1, 115.3, 212, 218–225
    See application file for complete search history.

(56) References Cited

U.S. PATENT DOCUMENTS

| 6,125,103 | A | 9/2000 | Bauml et al. |
|---|---|---|---|
| 7,061,991 | B2 | 6/2006 | Wright et al. |
| 7,190,292 | B2 | 3/2007 | Bizjak |
| 7,634,024 | B2 * | 12/2009 | Tan .............................. 375/297 |
| 2003/0161411 | A1 | 8/2003 | McCorcle et al. |
| 2004/0186867 | A1 | 9/2004 | Schenk |
| 2006/0014500 | A1 * | 1/2006 | Marsili ....................... 455/115.1 |
| 2006/0098749 | A1 | 5/2006 | Sung et al. |
| 2006/0165158 | A1 | 7/2006 | Richardson |
| 2008/0049864 | A1 | 2/2008 | Erikkson et al. |
| 2009/0029664 | A1 | 1/2009 | Batruni |
| 2009/0310710 | A1 | 12/2009 | Farrokhi |

FOREIGN PATENT DOCUMENTS

| WO | 2009017527 | 5/2009 |
|---|---|---|
| WO | 2009151579 | 12/2009 |

OTHER PUBLICATIONS

U.S. Appl. No. 11/881,821, filed Jan. 27, 2011, Roy G. Batruni, Notice of Allowance.

* cited by examiner

*Primary Examiner* — Christian A Hannon
(74) *Attorney, Agent, or Firm* — Sterne, Kessler, Goldstein & Fox P.L.L.C.

(57) ABSTRACT

A device for generating a crest factor reduced signal is disclosed. The device comprises an interface for receiving an input signal; a peak identifier for identifying one or more peak regions of the input signal; a squelch level determiner for determining a reduction of the input signal near the one or more peak regions; a squelcher for reducing the one or more peak regions of the input signal as indicated by the squelch level determiner; and an interface for outputting a crest factor reduced signal. The crest factor reduced signal has a reduced dynamic range due to the reduction of the one or more peak regions of the input signal. The crest factor reduced signal also has been filtered to reduce undesired frequency components by: calculating a difference between a squelched signal from the squelcher and the input signal, band-pass filtering the difference to generate a result, and summing the result with the input signal that has been delayed.

24 Claims, 14 Drawing Sheets

Dashed box or in text

CREST FACTOR REDUCTION

BACKGROUND OF THE INVENTION

Information in contemporary communication systems can be carried by modulated signals that go from employing only a single carrier to modulations that employ multiple carriers. These modulated signals are typically amplified prior to being transmitted either over a wired media or wirelessly, where the amplifier's performance must maintain linearity to ensure appropriate signal integrity.

When a signal is narrow band, such as is the case in a single carrier modulation scheme, the desired transmitted signal has almost a constant envelope where the ratio of the signal peak to the signal average is reasonably low. For the transmitter amplifier, this is desirable since the amplifier can be efficiently used in terms of its output power capabilities. However, when the signal is broad band, as is true when multiple carriers are used (e.g., when orthogonal frequency division modulation or wideband code division multiple access modulation), the desired transmitted signal spends less time at the peak signal ranges and the average signal value is much lower than the peak signal values. For the transmitter amplifier, this is undesirable since the amplifier needs to be adjusted so that it can accommodate the peak signals and yet spends most of its time outputting signals at a lower level. Typically, this leads to low efficiency for the power amplifier. One solution leading to more efficient usage of amplifier dynamic range is to cut off or squelch the peaks of the signal—for example, using a window squelching method. However, the determination of the window can be computationally complex and time consuming, and the squelching can distort signals beyond acceptable limits particularly in multi-carrier systems.

BRIEF DESCRIPTION OF THE DRAWINGS

Various embodiments of the invention are disclosed in the following detailed description and the accompanying drawings.

DETAILED DESCRIPTION

Figure 1A:
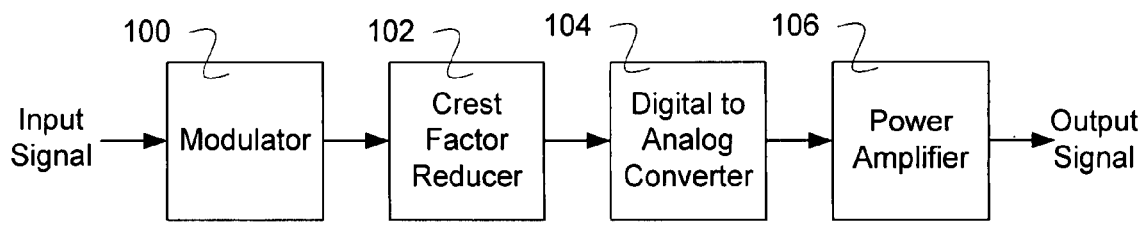
FIG. 1A is a block diagram illustrating an embodiment of a crest factor reduced signal calculation system.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Crest factor reduction is disclosed. Reducing signal peaks, or crests, can lead to higher amplifier efficiency by enabling better utilization of the amplifier's dynamic range. This can lead to higher signal power transmitted by the amplifier. A calculation is performed on an input signal indicating where and how the signal should be reduced. The signal is reduced around a peak signal. Frequency components that are introduced due to the signal suppression are reduced using a filter.

In some embodiments, a signal is reduced around a peak signal by locating a peak region. The peak region can be defined by either positive peaks or negative peaks. The peak region is located by taking an absolute value, smoothing (e.g., using a low-pass filtering), and identifying regions of the smoothed absolute valued signal that are above a threshold. For these identified regions, a squelch level is generated by smoothing the peak region, scaling and subtracting the result from unity. A delayed input signal is then squelched by multiplying by the squelch level. The result contains undesirable frequency components and these components are reduced using a filter before outputting the signal. The signal can be sent to a power amplifier to transmit the signal wirelessly or over a wired network. The dynamic range of the power amplifier is more effectively utilized because of the crest factor reduction or peak suppression. In various embodiments, the filtering of undesirable frequency components is achieved by filtering of the squelched input signal, by filtering an error signal (e.g., the difference between the input signal and the squelched input signal), or by any other appropriate filtering.

In some embodiments, an input signal is received. An absolute value signal is calculated from the input signal. A low-pass filtered signal is calculated from the absolute value signal. A threshold passed signal is calculated from the low-pass filtered signal. For example, the threshold passed signal is calculated by passing values greater than a threshold and not passing values lower than the threshold. A window convolved signal is calculated from the threshold passed signal. For example, the window convolved signal is calculated by convolving the threshold passed signal with a window function such as a Tukey, Hamming, Hanning or other appropriate windowing function. A squelch level signal is calculated from the window convolved signal. For example, the window convolved signal is scaled by multiplying and then subtracted from '1' to invert the signal. A squelched output signal is calculated from a delayed input signal and the squelch level signal. For example, the squelch output signal is calculated by multiplying the delayed input signal by the squelch level signal. A crest factor reduced signal is calculated from the squelched output signal. For example, the crest factor reduced signal is calculated by bandpass filtering the squelched output signal.

FIG. 1A is a block diagram illustrating an embodiment of a crest factor reduced signal calculation system. In the example shown, an input signal carries digital information desired to be output by a power amplifier. The input signal is input to modulator 100. The signal output by modulator 100 is input to crest factor reducer 102. Crest factor reducer 102 reduces peaks or crests to better utilize the dynamic range of a power amplifier such as power amplifier 106. The signal output by crest factor reducer 102 is input to digital to analog converter 104. The signal output by digital to analog converter 104 is input to power amplifier 106. The system output signal is output by power amplifier 106.

In various embodiments, the input signal is analog or the input signal is digital. In some embodiments, the input signal is analog, and the input signal is converted to a digital signal using an analog to digital converter. In some embodiments, the input signal is not modulated by modulator 100, and is directly input to crest factor reducer 102.

Figure 1B:
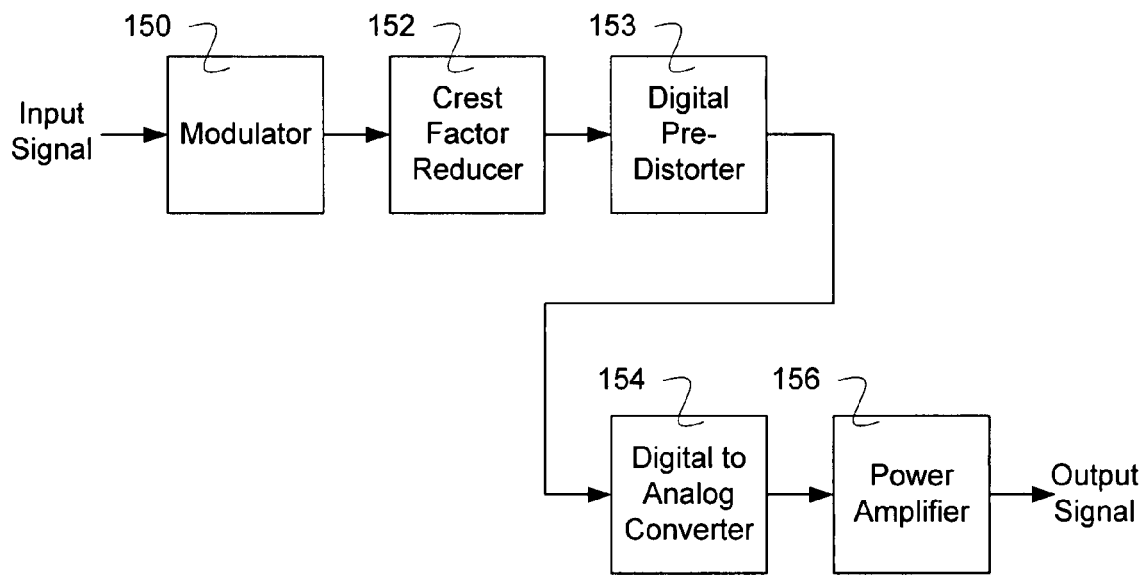
FIG. 1B is a block diagram illustrating an embodiment of a crest factor reduced signal calculation system.

FIG. 1B is a block diagram illustrating an embodiment of a crest factor reduced signal calculation system. In the example shown, an input signal carries digital information desired to be output by a power amplifier. The input signal is input to modulator 150. The signal output by modulator 150 is input to crest factor reducer 152. Crest factor reducer 152 reduces peaks or crests to better utilize the dynamic range of a power amplifier such as power amplifier 156. The signal output by crest factor reducer 152 is input to digital pre-distortion remover 153. Digital pre-distorter 153 pre-distorts a signal to remove distortion introduced by components in the system such as digital to analog converter 154 and/or power amplifier 156. The signal output by digital pre-distorter 153 is input to digital to analog converter 154. The signal output by digital to analog converter 154 is input to power amplifier 156. The system output signal is output by power amplifier 156.

In some embodiments, the input signal is analog. In some embodiments, the input signal is analog, and the input signal is converted to a digital signal using an analog to digital converter. In some embodiments, the input signal is not modulated by modulator 150, and is directly input to crest factor reducer 152.

Figure 2:
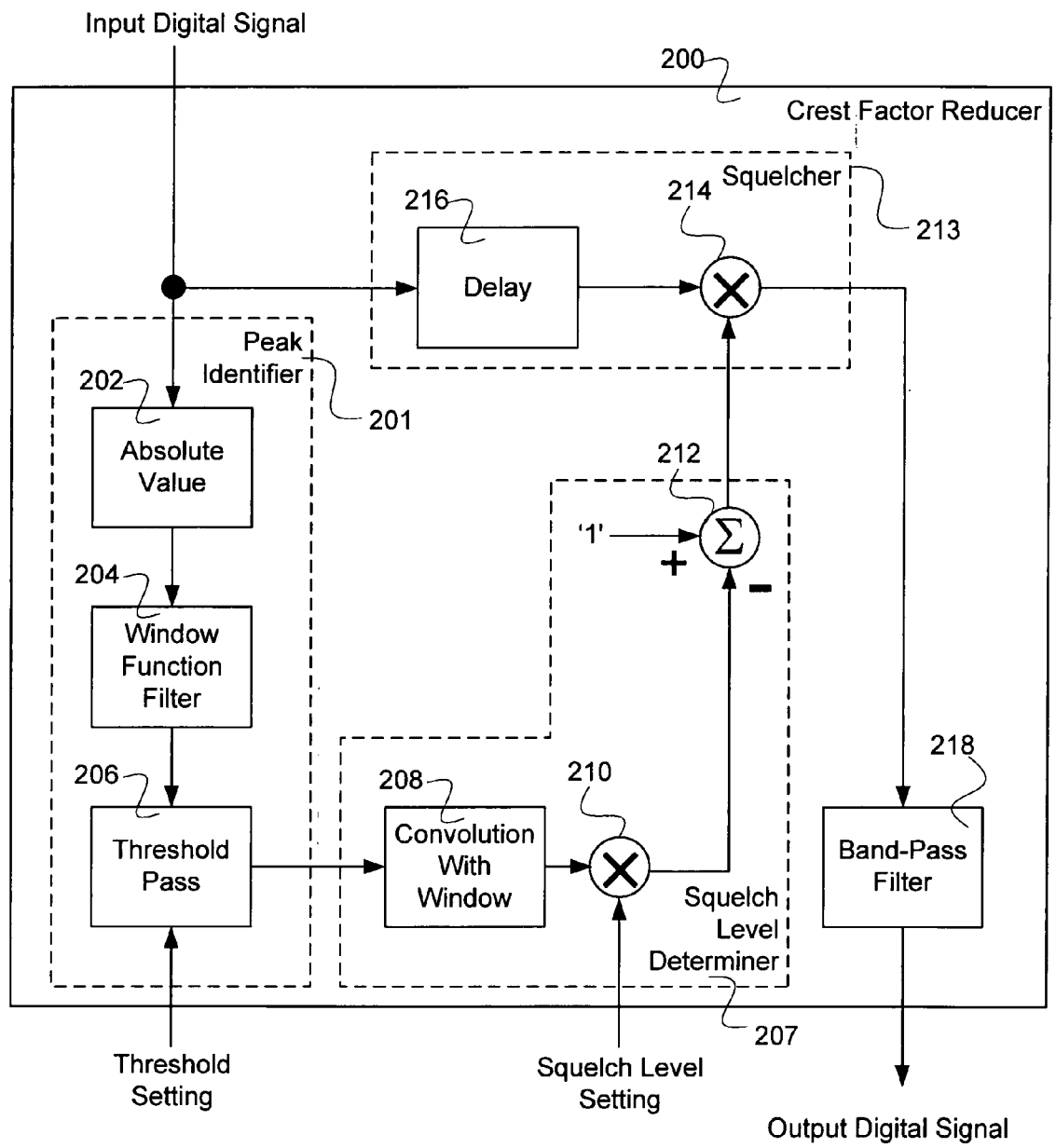
FIG. 2 is a block diagram illustrating an embodiment of a crest factor reducer.

FIG. 2 is a block diagram illustrating an embodiment of a crest factor reducer. In some embodiments, the crest factor reducer of FIG. 2 is used to implement crest factor reducer 102 of FIG. 1A and/or crest factor reducer 152 of FIG. 1B. In the example shown, an input digital signal to crest factor reducer 200 is input to absolute value 202 and delay 216. Peak identifier 201 includes absolute value 202, window function 204, and threshold pass 206. Peak identifier 201 identifies regions of the input digital signal that include peaks that need to be reduced. Absolute value 202 calculates an absolute value signal and outputs to window function 204. Window function 204 low pass filters the input absolute value signal and outputs to threshold pass 206. Window function 204 low pass filters its input signal using a convolution with a Tukey, Hamming, Hanning, or other appropriate window function. Threshold pass 206 outputs its input signal in the event that its input signal is above a threshold (as set by a threshold setting), and in the event that its input signal is below a threshold outputs a zero or null signal. Threshold pass 206 outputs to convolution with window 208. Squelch level determiner 207 includes convolution with window 208, multiplier 210, and summing node 212. Squelch level determiner 207 determines a level to reduce the input signal in regions near peaks of the digital input signal. Convolution with window 208 low pass filters its input using a convolution with a Tukey, Hamming, Hanning, or other appropriate window function. Convolution with window 208 outputs to multiplier 210. Multiplier 210 multiplies the output of convolution with window 208 by a squelch level setting value. This scales the squelching. In some embodiments, the squelch level setting value depends on a peak value so that squelching produces a substantially constant peak value for a peak after squelching. In various embodiments, the squelch level setting value is constant or a variable that reduces a peak value to enable efficient use of a power amplifier dynamic range. In some embodiments, the threshold setting is user settable, is settable based at least in part on the amplitude of a peak or crest or the amplitude of a highest peak or crest, or any other appropriate manner of selecting a threshold setting.

Multiplier 210 outputs to summing node 212. Summing node 212 subtracts the output of multiplier 210 from '1' or another suitable constant value. Summing node 212 outputs to multiplier 214. Squelcher 213 includes multiplier 214 and delay 216. Squelcher 213 reduces the digital input signal by the squelch level. Multiplier 214 multiplies the output of summing node 212 with the output of delay 216. Delay 216 outputs a delayed version of the input digital signal to crest factor reducer 200. Delay 216 is designed to delay the input signal so that the output signal of summing node 212 is aligned in time with its corresponding signal for the input signal so that the multiplier squelches the appropriate portion (e.g., the peaks or crests) of the input signal to crest factor reducer 200. Multiplier 214 outputs to band-pass filter 218. Band-pass filter 218 removes distortion in frequency regions of the output signal from multiplier 214 that are undesirable. For example, for power amplifier outputs that are supposed to conform to a standard for wired or wireless protocols distortion of signal energy in acceptable bands into bands neighboring the transmission bands may be specified (e.g., unacceptable). In various embodiments, band-pass filter 218 comprises a finite impulse response filter, an infinite impulse response filter, a Butterworth, a Chebyshev, an elliptic, a Bessel, a Gaussian, or any other appropriate filter type. Band-pass filter 218 produces an output signal that comprises the output signal of crest factor reducer 200.

Figure 3:
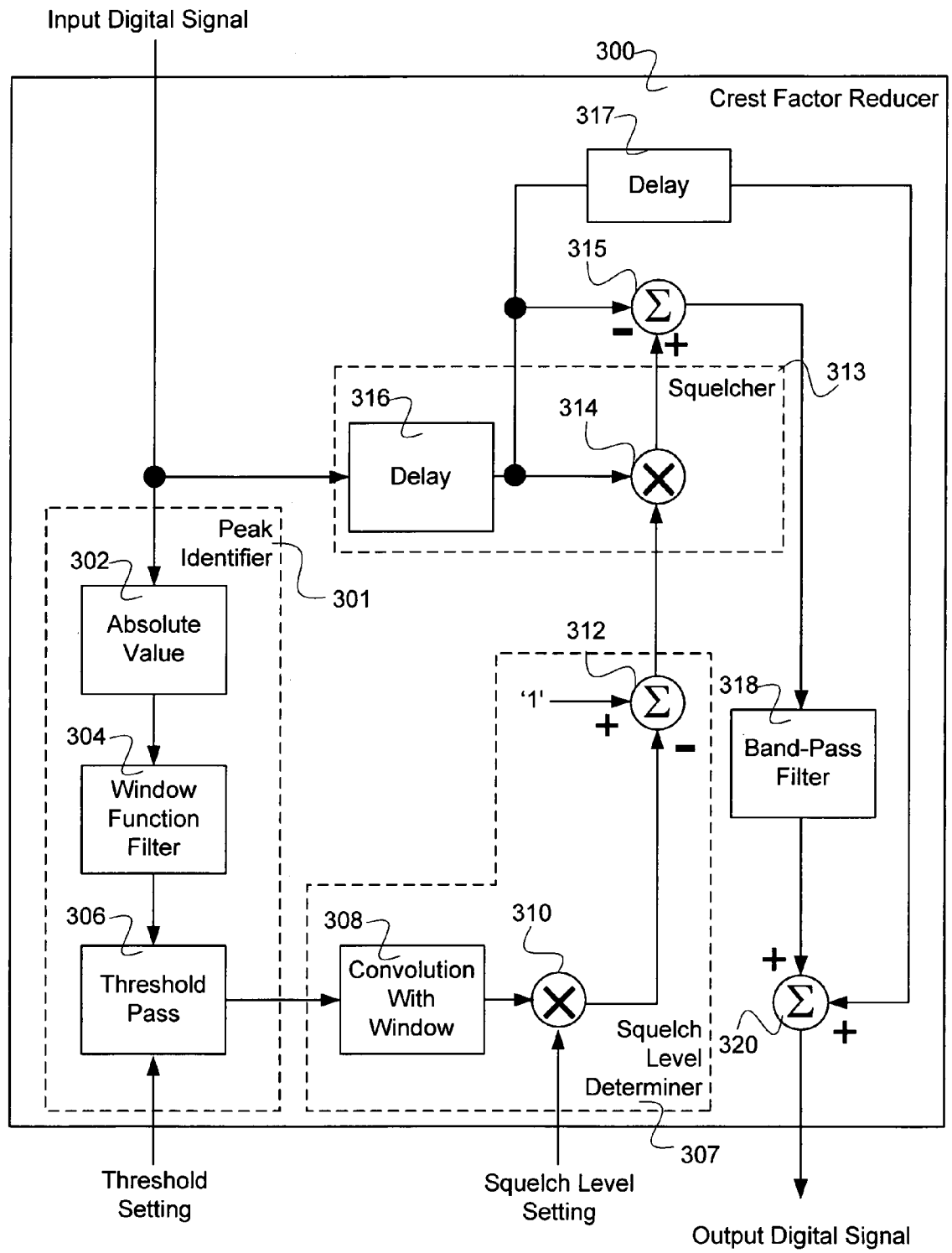
FIG. 3 is a block diagram illustrating an embodiment of a crest factor reducer.

FIG. 3 is a block diagram illustrating an embodiment of a crest factor reducer. In some embodiments, the crest factor reducer of FIG. 3 is used to implement crest factor reducer 102 of FIG. 1A and/or crest factor reducer 152 of FIG. 1B. In the example shown, an input digital signal to crest factor reducer 300 is input to absolute value 302 and delay 316. Peak identifier 301 includes absolute value 302, window function 304, and threshold pass 306. Peak identifier 301 identifies regions of the input digital signal that include peaks that need to be reduced. Absolute value 302 calculates an absolute value signal and outputs to window function 304. Window function 304 low pass filters the input absolute value signal and outputs to threshold pass 306. Window function 304 low pass filters its input signal using a convolution with a Tukey, Hamming, Hanning, or other appropriate window function. Threshold pass 306 outputs its input signal in the event that its input signal is above a threshold (as set by a threshold setting) and in the event that its input signal is below a threshold outputs a zero or null signal. Threshold pass 306 outputs to convolution with window 308. Squelch level determiner 307 includes convolution with window 308, multiplier 310, and summing node 312. Squelch level determiner 307 determines a level to reduce the input signal in regions near peaks of the digital input signal. Convolution with window 308 low pass filters its input using a convolution with a Tukey, Hamming, Hanning, or other appropriate window function. Convolution with window 308 outputs to multiplier 310. Multiplier 310 multiplies the output of convolution with window 308 by a squelch level setting value. This scales the squelching. In some embodiments, the squelch level setting value depends on a peak value so that squelching produces a substantially constant peak value for a peak after squelching. In various embodiments, the squelch level setting value is constant or a variable that reduces a peak value to enable efficient use of a power amplifier dynamic range.

Multiplier 310 outputs to summing node 312. Summing node 312 subtracts the output of multiplier 310 from '1' or another suitable constant value. Summing node 312 outputs to multiplier 314. Squelcher 313 includes multiplier 314 and delay 316. Squelcher 313 reduces the digital input signal by the squelch level. Multiplier 314 multiplies the output of summing node 312 with the output of delay 316. Delay 316 outputs a delayed version of the input digital signal to crest factor reducer 300. Delay 316 is designed to delay the input signal so that the output signal of summing node 312 is aligned in time with its corresponding signal for the input signal so that the multiplier squelches the appropriate portion (e.g., the peaks or crests) of the input signal to crest factor reducer 300. Multiplier 314 outputs to summing node 315. Summing node 315 subtracts the output of delay 316 from the output of multiplier 314 to create an error signal. The error signal is the difference between the input signal and the squelched signal. Summing node 315 outputs to band-pass filter 318. Band-pass filter 318 removes distortion in frequency regions of the output signal from multiplier 314 that are undesirable. For example, for power amplifier outputs that are supposed to conform to a standard for wired or wireless protocols distortion of signal energy in acceptable bands into bands neighboring the transmission bands may be specified (e.g., unacceptable). In various embodiments, band-pass filter 318 comprises a finite impulse response filter, an infinite impulse response filter, a Butterworth, a Chebyshev, an elliptic, a Bessel, a Gaussian, or any other appropriate filter type. Band-pass filtering the error signal has reduced constraints (e.g., a relaxed roll-off criteria) because the desired input signal is not being filtered by the band-pass filter; Presumably, the input signal has the desired set of frequency and amplitude characteristics that are appropriate for the protocol being observed and, therefore, is not being distorted by the band-pass filter. These reduced constraints can result in a less complex filter to achieve the same level of suppression as band-pass filter 218 (e.g., fewer multipliers and fewer coefficients) and hence less expensive filter. Or, the reduced constraints can result in band-pass filter 318 achieving higher suppression of frequency components outside of the signal band using the same complexity filter as band-pass filter 218. Band-pass filter 318 outputs to summing node 320. Summing node 320 adds the output of delay 317 to the output of band-pass filter 318. Delay 317 is a delayed version of the signal output from delay 316 (which in turn is a delayed version of the input signal to crest factor reducer 300). Summing node 320 produces a squelched version of the input signal by adding in a band-limited version of a squelching signal to the input signal. Summing node 320 produces an output signal comprises the output of crest factor reducer 300.

Figure 4:
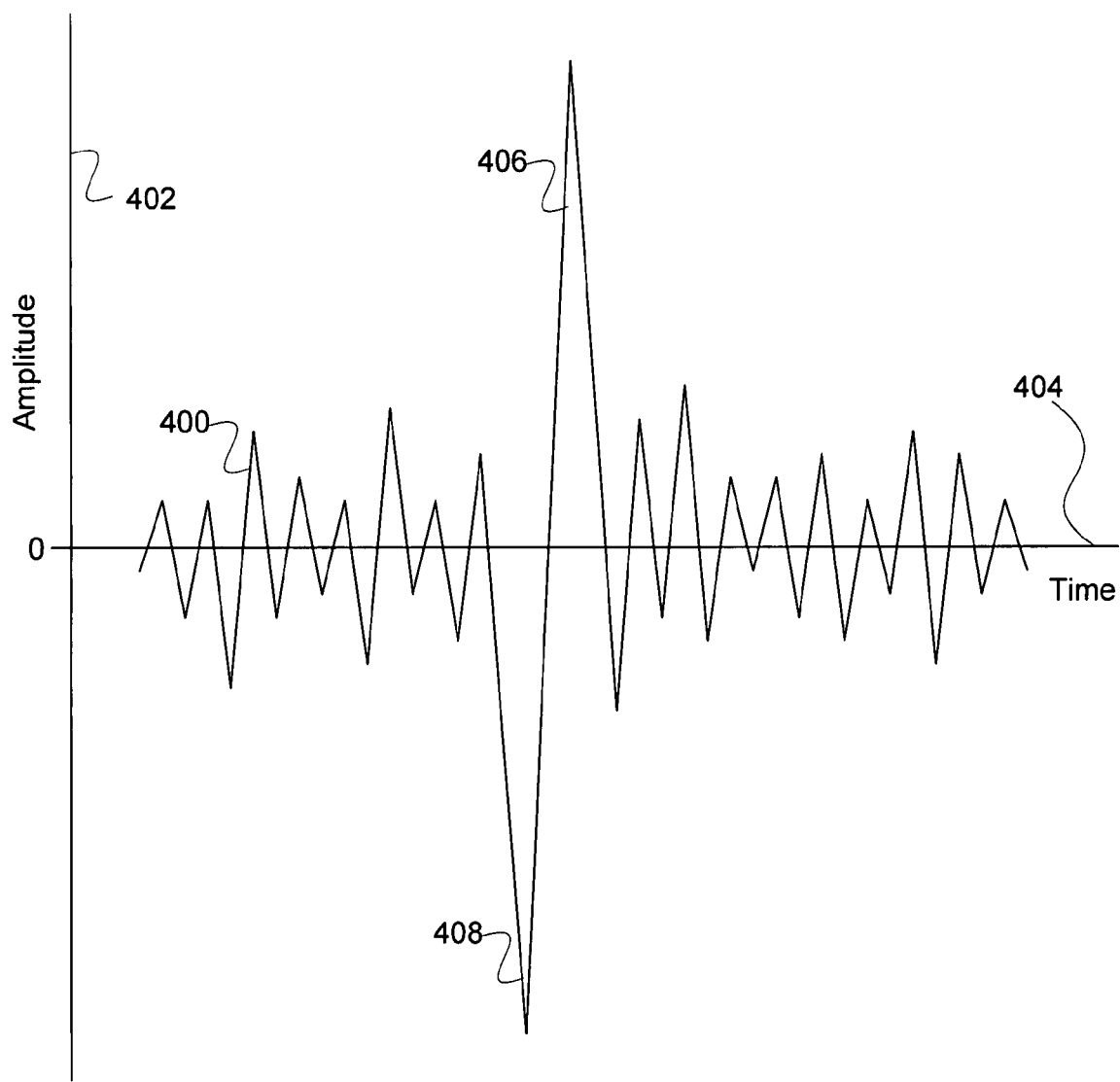
FIG. 4 is a graph illustrating an embodiment of an input signal.

FIG. 4 is a graph illustrating an embodiment of an input signal. In the example shown, line 400 illustrates an input signal to a crest factor reducer. X-axis 404 represents time, y-axis 402 represents amplitude. Note the input signal has amplitudes that are mostly near the zero value of y-axis 402. There is one large positive amplitude swing near marker 406. There is one large negative amplitude swing near marker 408. An amplifier such as a power amplifier would need to allow for the large positive amplitude swing and the large negative amplitude swing when considering the setting of its gain and use of its dynamic range. In reserving the entire amplitude range from the large positive peak to the large negative peak, for most of the illustrated input signal the amplifier would be using a small fraction of its dynamic range. The crest factor reducer is designed to suppress the large amplitude negative and positive swings to make better use of dynamic range without too much distortion.

Figure 5:
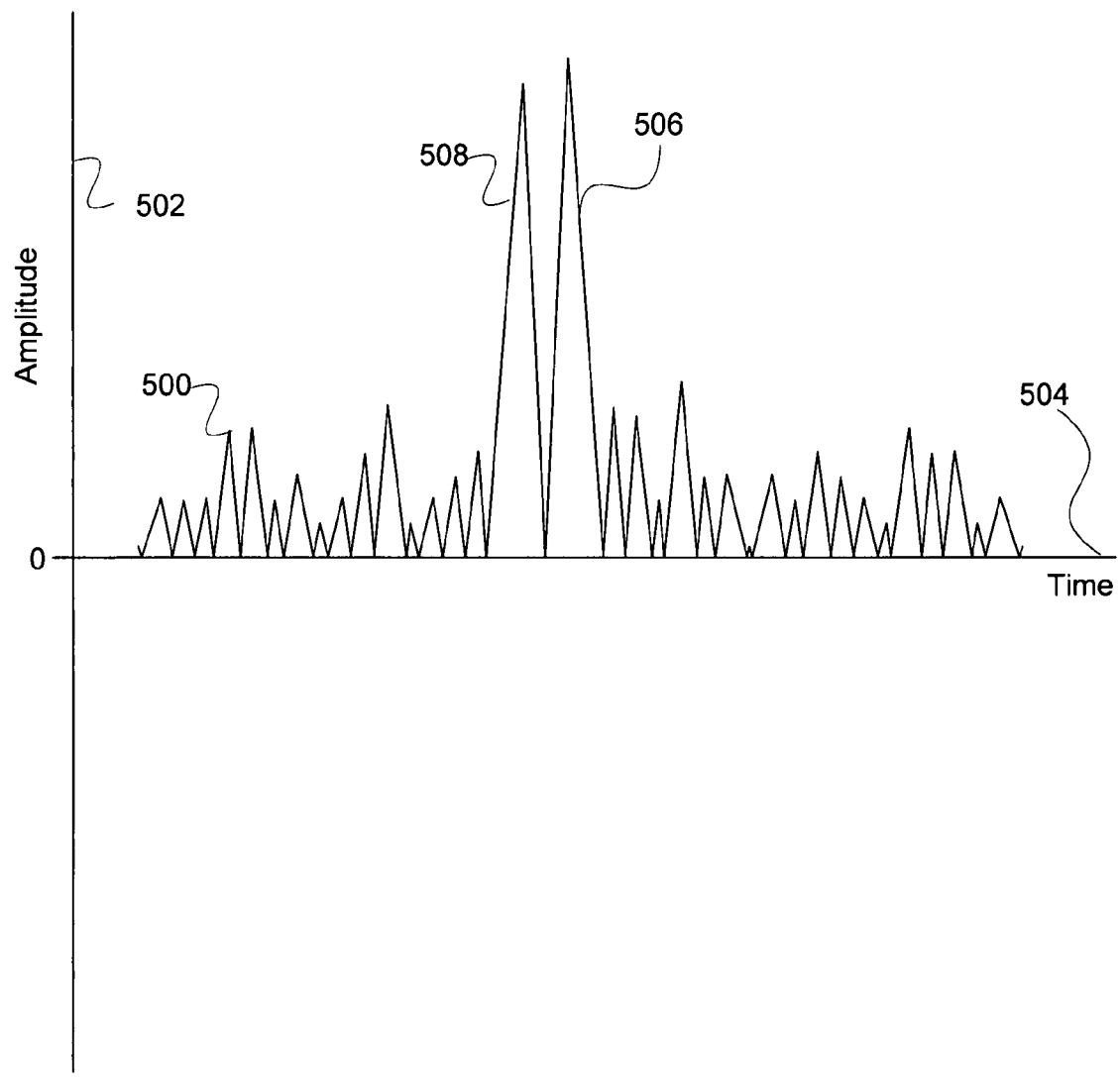
FIG. 5 is a graph illustrating an embodiment of an absolute value of an input signal.

FIG. 5 is a graph illustrating an embodiment of an absolute value of an input signal. In some embodiments, the absolute value signal illustrated in FIG. 5 represents an absolute value of the input signal illustrated in FIG. 4. In the example shown, line 500 illustrates an absolute value of an input signal internal to a crest factor reducer. X-axis 504 represents time, and y-axis 502 represents amplitude. Note the absolute value of the input signal has all positive amplitudes that are mostly near the zero value of y-axis 402. There are two large swings: one large positive amplitude swing near marker 506 corresponding to the swing of the input signal near marker 406 in FIG. 4, and another positive swing near marker 508 corresponding to the large negative amplitude swing of the input signal near marker 408 in FIG. 4.

Figure 6:
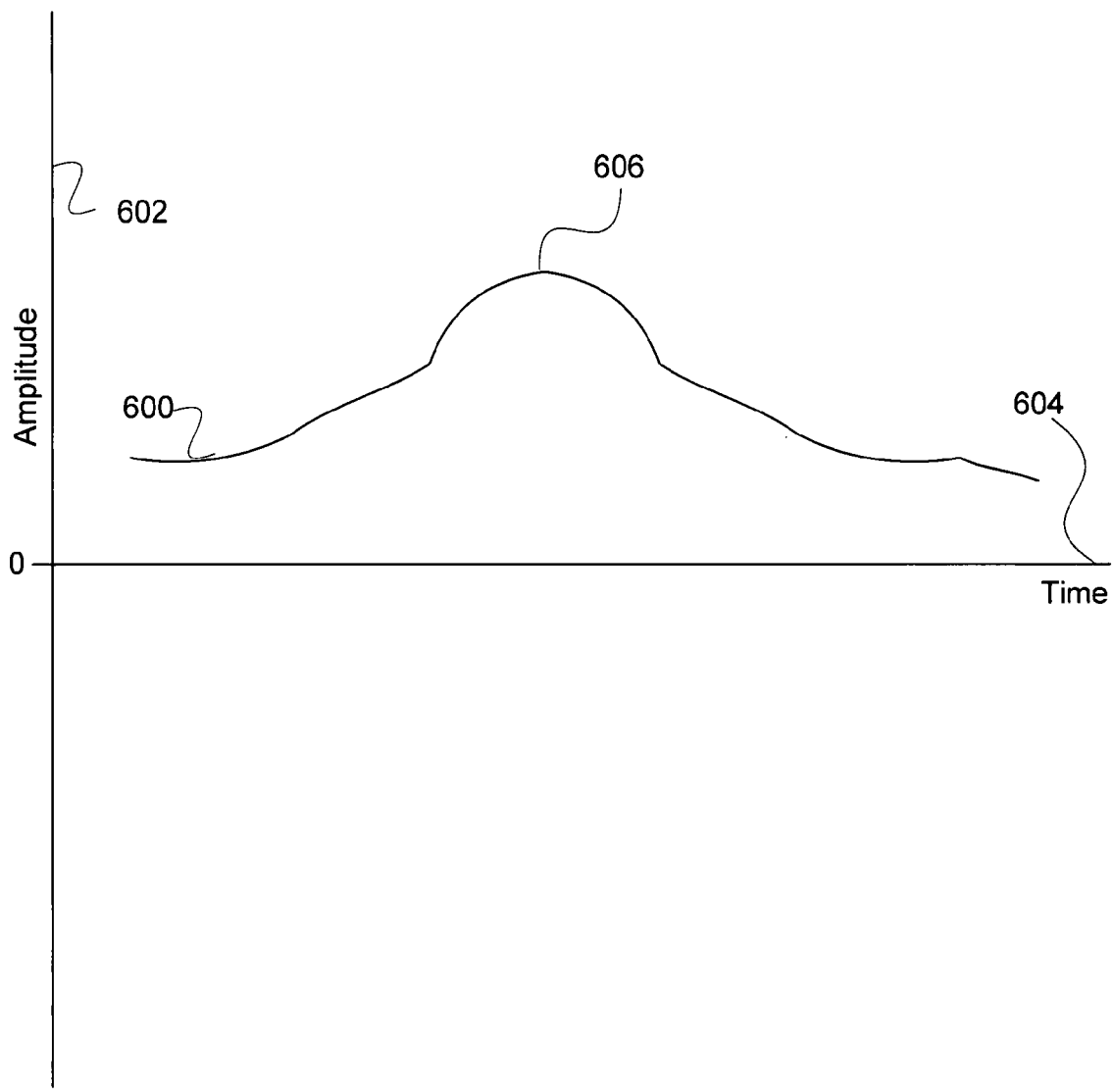
FIG. 6 is a graph illustrating an embodiment of a low-pass filter signal.

FIG. 6 is a graph illustrating an embodiment of a low-pass filter signal. In some embodiments, the signal of FIG. 6 represents a low-pass filtered version of the absolute value signal illustrated in FIG. 5. In the example shown, line 600 illustrates a low-pass filtered signal internal to a crest factor reducer. X-axis 604 represents time, and y-axis 602 represents amplitude. Note the low-pass filtered version of the absolute value signal has all positive amplitudes where the signal has considerably fewer peaks and troughs; for example, there is only broad peak 606 corresponding to the two large swings of FIG. 5 (the peaks near marker 506 and 508 of FIG. 5).

Figure 7:
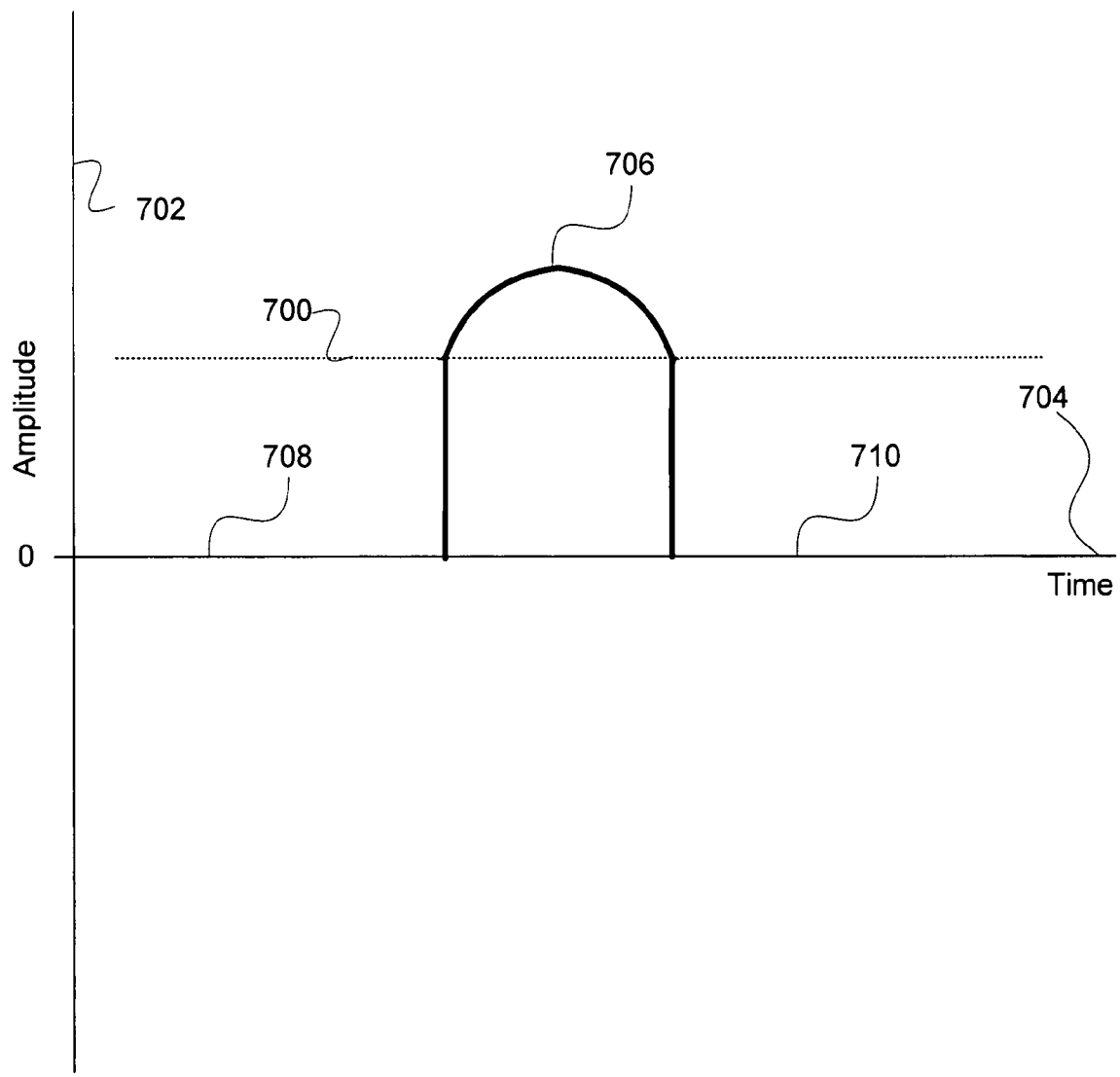
FIG. 7 is a graph illustrating an embodiment of a threshold passed signal.

FIG. 7 is a graph illustrating an embodiment of a threshold passed signal. In some embodiments, the signal of FIG. 7 represents a threshold passed signal of the low-pass filtered signal illustrated in FIG. 6. In the example shown, threshold 600 is used to determine if a signal is allowed to pass through or not. For the signal corresponding to times near marker 708 and near marker 710, the low-pass filtered signal input to the threshold passed processing block is below threshold 700 so that threshold passed signal is 0. For the signal corresponding to times near marker 706, the low-pass filtered signal input to the threshold passed processing block is above threshold 700 so that threshold passed signal is the same as the input low-pass filtered signal. X-axis 704 represents time, and y-axis 702 represents amplitude. In various embodiments, threshold 700 is settable (e.g., by a user), is fixed, is set based at least in part on the signal level input to the threshold passed processing block, is based on the a maximum signal level received, is based on statistics of the signal (e.g., average, standard deviation, peaks as measured in standard deviations, peak as present in a quartile of peak level, etc.), or is set in any other appropriate manner of setting a threshold.

Figure 8:
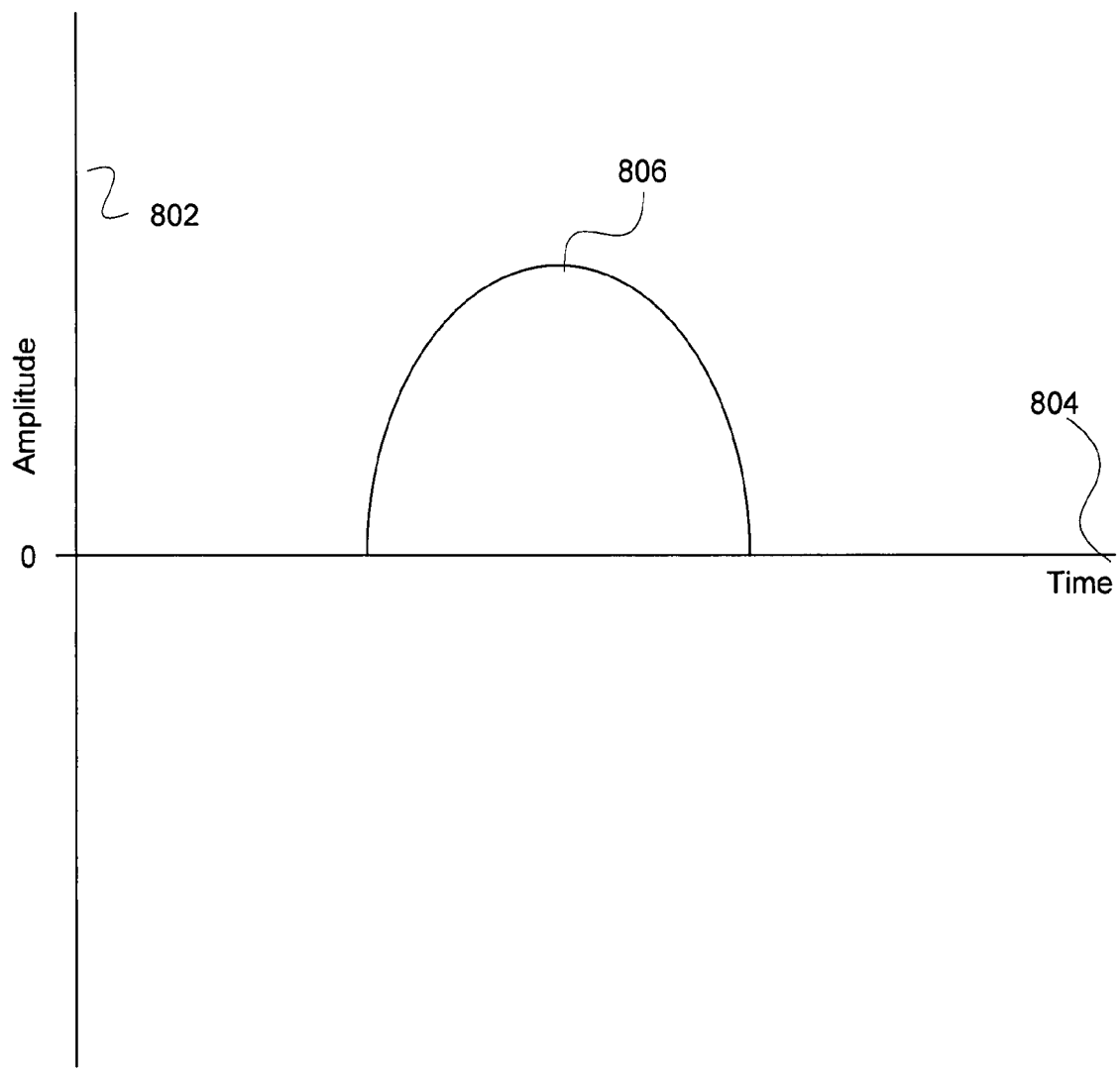
FIG. 8 is a graph illustrating an embodiment of a window convolved signal.

FIG. 8 is a graph illustrating an embodiment of a window convolved signal. In some embodiments, the signal of FIG. 8 represents a signal resulting from convolving a window function with the threshold passed signal illustrated in FIG. 7. In the example shown, window convolved signal 806 results from convolving a threshold passed signal with a window function. In various embodiments, the window function comprises a Tukey, a Hamming, a Hanning, or any other appropriate window function. used to determine if a signal is allowed to pass through or not. X-axis 804 represents time, and y-axis 802 represents amplitude.

Figure 9:
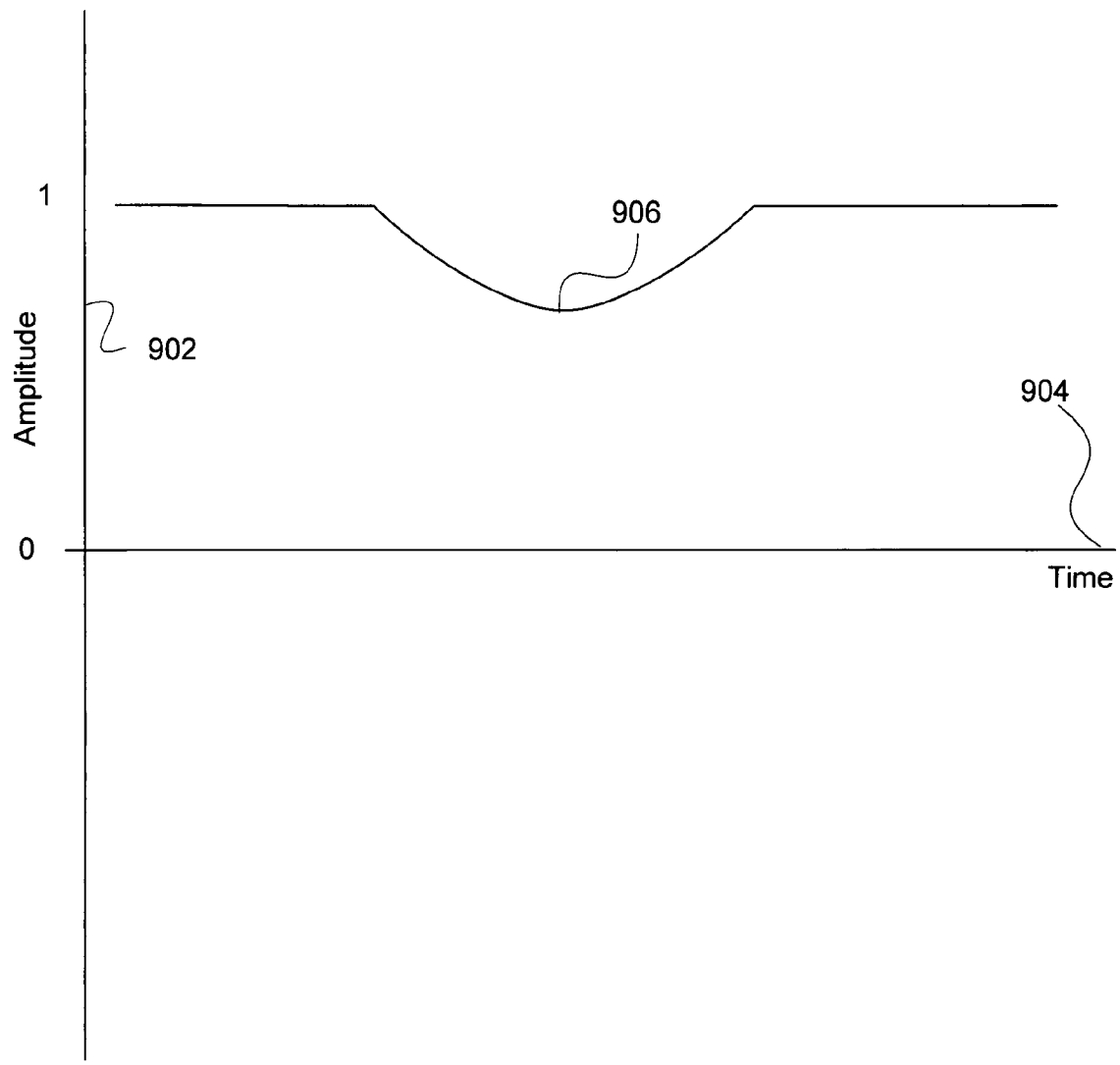
FIG. 9 is a graph illustrating an embodiment of a squelch level signal.

FIG. 9 is a graph illustrating an embodiment of a squelch level signal. In some embodiments, the signal of FIG. 9 represents a signal resulting from inverting and offsetting a scaled convolved window signal of FIG. 8. In the example shown, squelch level signal 906 results from subtracting a convolved window signal from '1' after scaling the convolved window signal by a scaling factor (e.g., using a multiplier). In various embodiments, the scaling of the convolved window signal is fixed, is settable (e.g., by a user), is based at least in part on an amplitude of a corresponding peak or other peak in the input signal to the crest factor reducer, is based at least in part on a statistic of the input signal to the crest factor reducer (e.g., average signal, peak signal, peak with in a window of time, etc.), or any other appropriate manner of setting a scaling factor. X-axis 904 represents time, and y-axis 902 represents amplitude.

Figure 10:
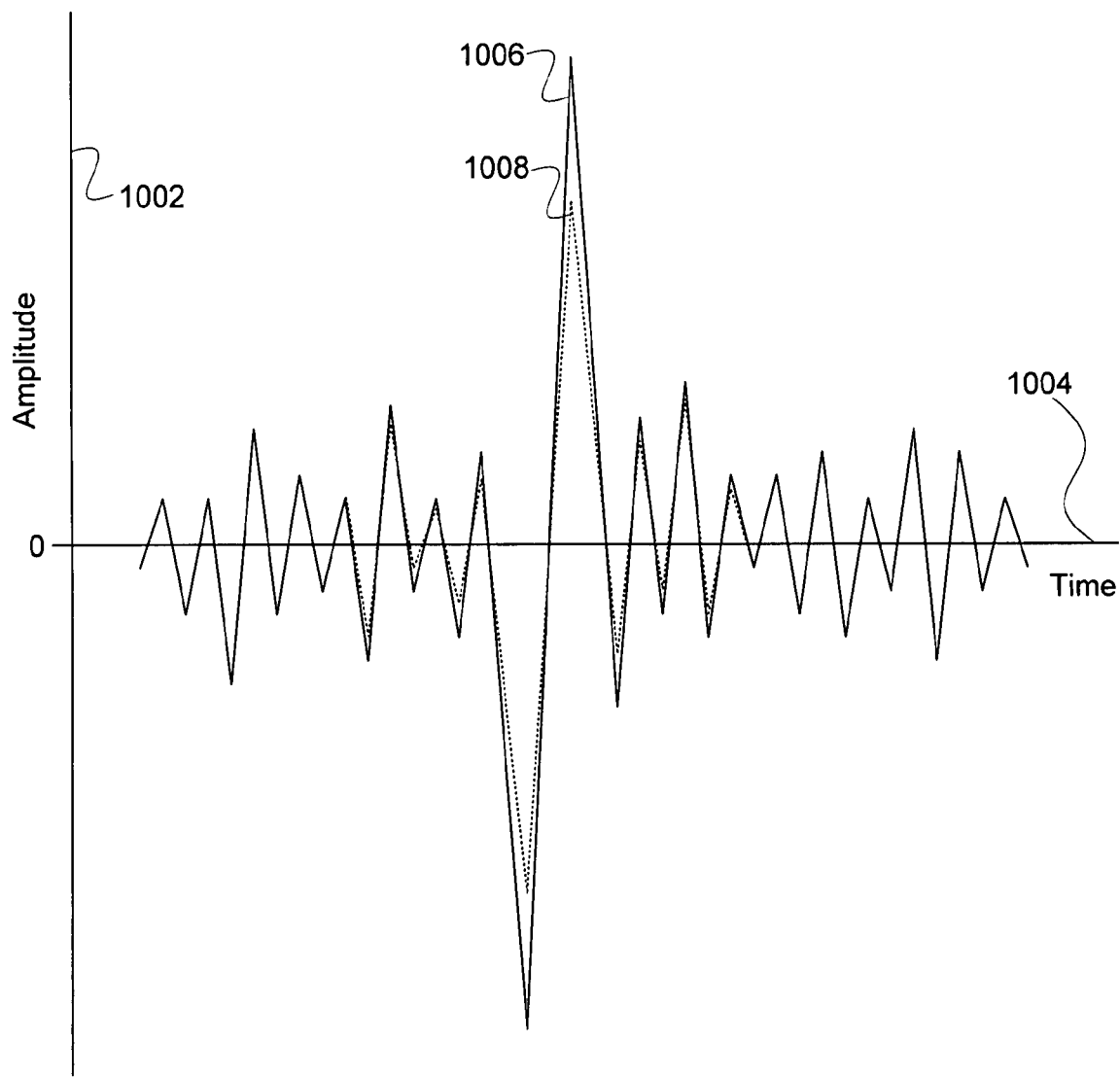
FIG. 10 is a graph illustrating an embodiment of a squelched output signal.

FIG. 10 is a graph illustrating an embodiment of a squelched output signal. In some embodiments, the signal of FIG. 10 represents a signal resulting from multiplying a squelch level signal of FIG. 9 with a delayed version of the input signal to a crest factor reducer. In the example shown, squelch output signal 1008 (dashed line) results from multiplying a squelch level signal and a delayed crest factor reducer input signal. Input signal 1006 (solid line) to the crest factor reducer is shown for comparison. In graph areas where both squelch output signal 1008 and input signal 1006 are the same only a solid line appears. The delay of the delayed crest factor reducer input signal is designed to align the input signal with the squelch level signal so that the correct portions of the input signal are squelched. In other words, given processing to the input signal designed to create a squelch level signal from the input signal, applying the processed squelch level signal to the appropriate corresponding input signal portions so that the peaks or crests of the input signal are suppressed or are made more appropriate for utilizing a subsequent power amplifier's dynamic range more efficiently. X-axis 1004 represents time, and y-axis 1002 represents amplitude.

Figure 11A:
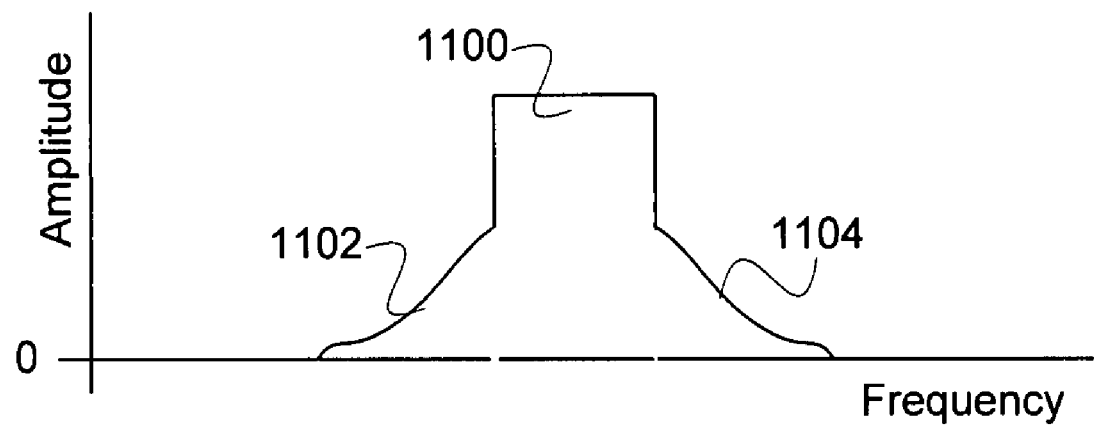
FIG. 11A is a graph illustrating an embodiment of a spectrum of a squelch output signal.

FIG. 11A is a graph illustrating an embodiment of a spectrum of a squelch output signal. In some embodiments, the spectrum of FIG. 11A is a spectrum of the time signal of the graph of FIG. 10. In the example shown, a spectrum graph showing an amplitude of energy in a signal as a function of frequency includes section 1100 where the signal energy is shown to be uniform within a band of frequencies and tails 1102 and 1104. Section 1100 represents the information that is being transmitted (e.g., a data or input signal modulated by a modulator). Tails 1102 and 1102 arise from distortion introduced by reducing the crest factors or amplitudes of the signal. In some embodiments, the spectrum graph needs to conform to a standard or other requirements as to energy that is outside of a given band specification. To achieve the conformation to the requirements, the signal represented by the spectrum graph is filtered. The filter will need to preserve the signal information in section 1100 while suppressing the tails 1102 and 1104.

Figure 11B:
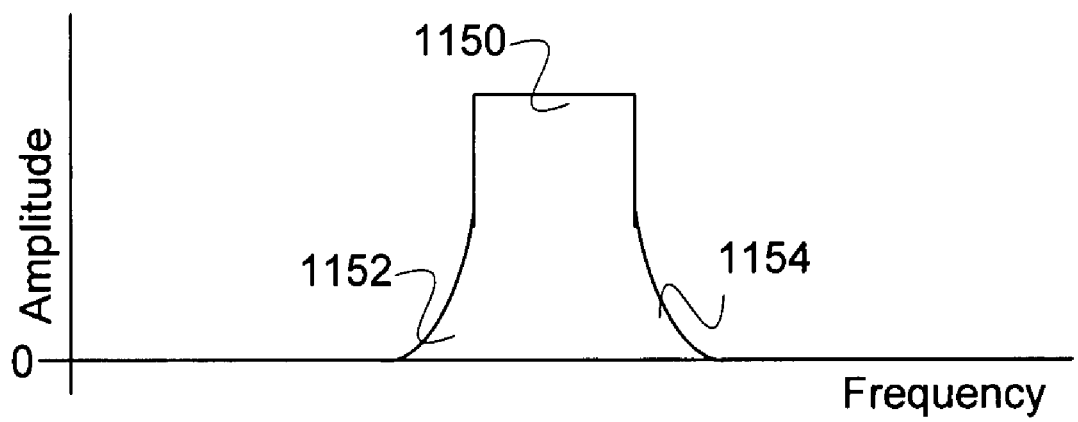
FIG. 11B is a graph illustrating an embodiment of a filtered spectrum of a squelch output signal.

FIG. 11B is a graph illustrating an embodiment of a filtered spectrum of a squelch output signal. In some embodiments, the spectrum of FIG. 11B is a filtered spectrum of FIG. 10. In the example shown, a filter which passes the spectrum in section 1150 where the signal energy is shown to be uniform within a band of frequencies with minimal to no distortion. Section 1150 represents the information that is being transmitted (e.g., a data or input signal modulated by a modulator) so it should not be affected, or affected minimally, by the filtering. Tails 1152 and 1154 are suppressed to the requirements as stipulated—for example, a standard for the system indicates how much energy is allowed to be out of the band. The suppression of the tails is achieved using a band-pass filter (such as band-pass filter 218 of FIG. 2).

Figure 12A:
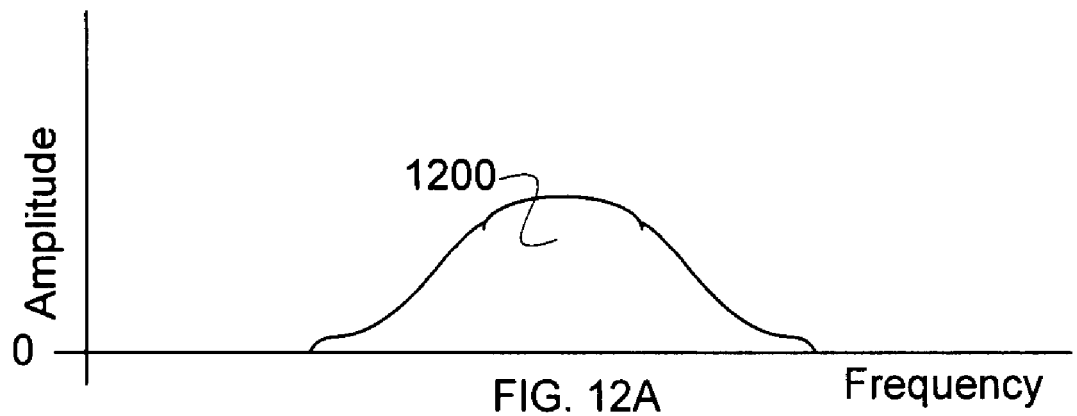
FIG. 12A is a graph illustrating an embodiment of a spectrum of an error signal.

FIG. 12A is a graph illustrating an embodiment of a spectrum of an error signal. In some embodiments, the spectrum of FIG. 12A represents the spectrum of the signal as output by a summing node such as summing node 315 of FIG. 3. In the example shown, error signal spectrum 1200 shows the amplitude of energy in the error signal, where the error signal is the difference between the squelch output signal and the crest factor reducer input signal.

Figure 12B:
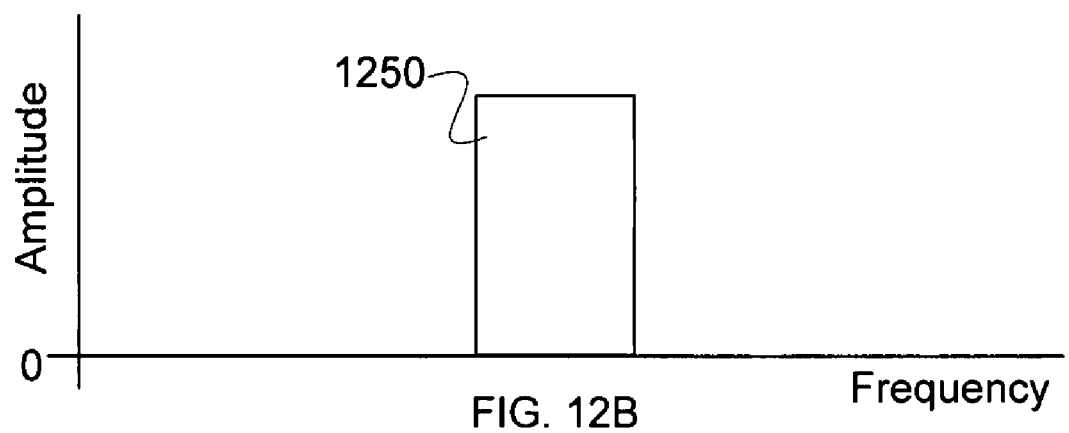
FIG. 12B is a graph illustrating an embodiment of a spectrum of an input signal to a crest factor reducer.

FIG. 12B is a graph illustrating an embodiment of a spectrum of an input signal to a crest factor reducer. In the example shown, spectrum 1250 shows a modulated signal energy as being relatively flat across a band.

Figure 12C:
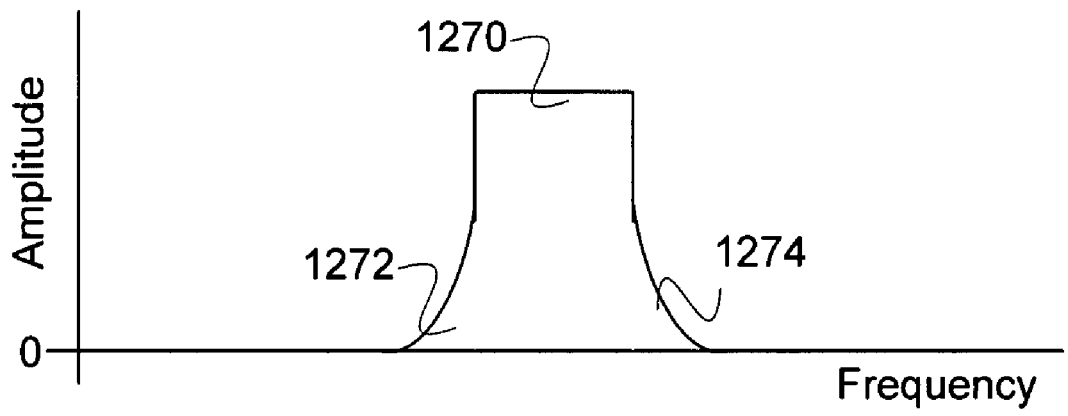
FIG. 12C is a graph illustrating an embodiment of a spectrum of an output signal to a crest factor reducer.

FIG. 12C is a graph illustrating an embodiment of a spectrum of an output signal to a crest factor reducer. In the example shown, section 1270 represents the input signal to the crest factor (e.g., the spectrum 1250 of FIG. 12B) combined with energy from the filtered error signal, and tails 1272 and 1274 represent a filtered version of the error signal. When signals represented by the spectrum of the error signal and the spectrum of the crest factor reducer are combined, the resulting spectrum meets the requirements for the signal (e.g., those stipulated by a standard). Also, filtering the error signal allows reduced requirements for the filter since no signal energy is being filtered, thus reducing filter size and complexity (and therefore cost). In some embodiments, the combined signal is similar to the output signal achieved for crest factor reducer 300 of FIG. 3.

Figure 13:
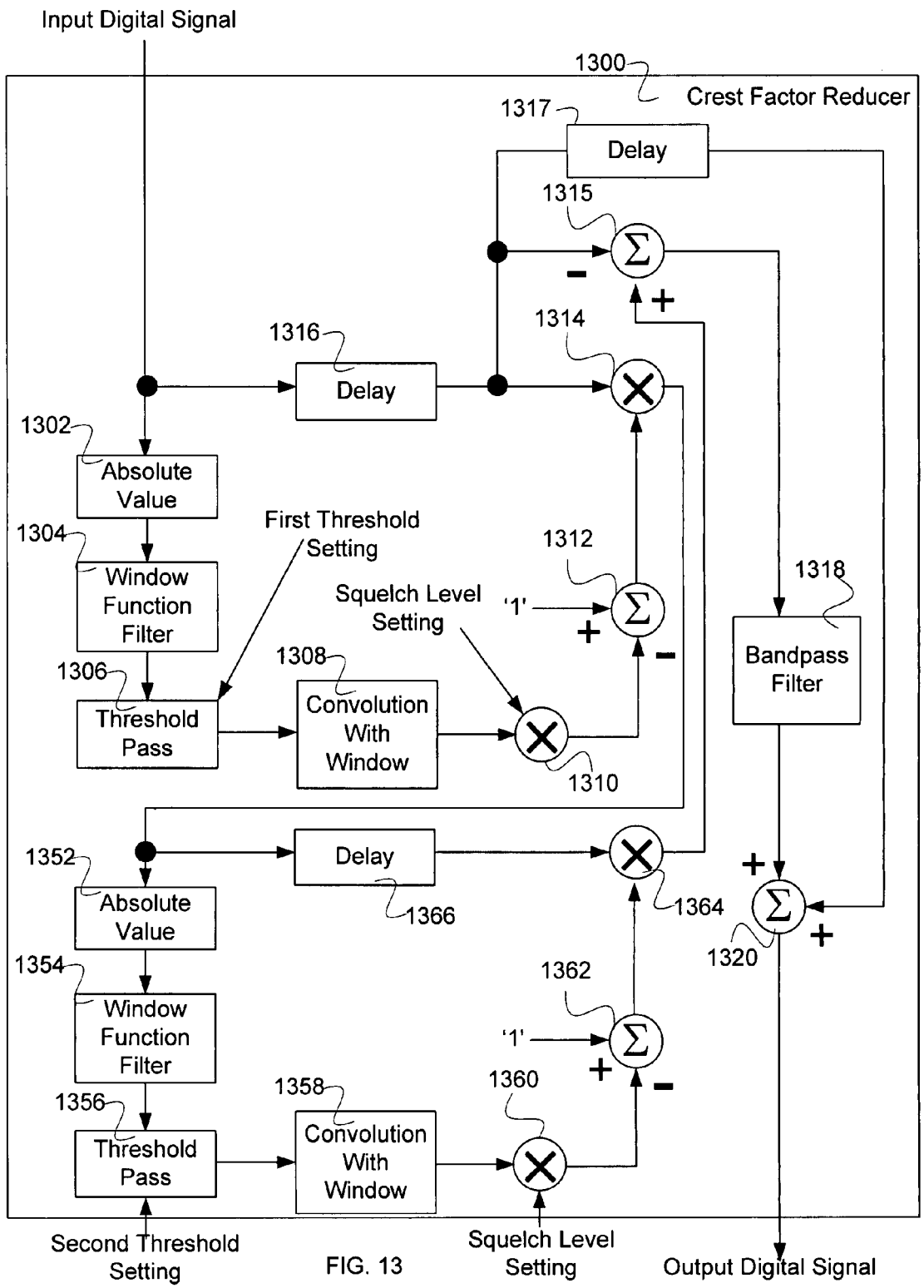
FIG. 13 is a block diagram illustrating an embodiment of a multi-stage crest factor reducer.

FIG. 13 is a block diagram illustrating an embodiment of a multi-stage crest factor reducer. In some embodiments, the crest factor reducer of FIG. 13 is used to implement crest factor reducer 102 of FIG. 1A and/or crest factor reducer 152 of FIG. 1B. In the example shown, an input digital signal to crest factor reducer 1300 is input to absolute value 1302 and delay 1316. Absolute value 1302 calculates an absolute value signal and outputs to window function 1304. Window function 1304 low pass filters the input absolute value signal and outputs to threshold pass 1306. Window function 1304 low pass filters its input signal using a convolution with a Tukey, Hamming, Hanning, or other appropriate window function. Threshold pass 1306 outputs its input signal in the event that its input signal is above a first threshold (as set by a first threshold setting) and in the event that its input signal is below a threshold outputs a zero or null signal. Threshold pass 1306 outputs to convolution with window 1308. Convolution with window 1308 low pass filters its input using a convolution with a Tukey, Hamming, Hanning, or other appropriate window function. Convolution with window 1308 outputs to multiplier 1310. Multiplier 1310 multiplies the output of convolution with window 1308 by a squelch level setting value. This scales the squelching. In some embodiments, the squelch level setting value depends on a peak value so that squelching produces a substantially constant peak value for a peak after squelching. In various embodiments, the squelch level setting value is constant or a variable that reduces a peak value to enable efficient use of a power amplifier dynamic range.

Multiplier 1310 outputs to summing node 1312. Summing node 1312 subtracts the output of multiplier 1310 from '1' or another suitable constant value. Summing node 1312 outputs to multiplier 1314. Multiplier 1314 multiplies the output of summing node 1312 with the output of delay 1316. Delay 1316 outputs a delayed version of the input digital signal to crest factor reducer 1300. Delay 1316 is designed to delay the input signal so that the output signal of summing node 1312 is aligned in time with its corresponding signal for the input signal so that the multiplier squelches the appropriate portion (e.g., the peaks or crests) of the input signal to crest factor reducer 1300. Multiplier 1314 outputs to an additional stage. The additional stage enables different amplitude peaks to be suppressed by different amounts. In various embodiments, 3, 4, or more stages are present to suppress peaks or crests in the input signal.

The second stage input signal is passed to absolute value 1352 and delay 1366. Absolute value 1352 calculates an absolute value signal and outputs to window function 1354. Window function 1354 low pass filters the input absolute value signal and outputs to threshold pass 1356. Window function 1354 low pass filters its input signal using a convolution with a Tukey, Hamming, Hanning, or other appropriate window function. Threshold pass 1356 outputs its input signal in the event that its input signal is above a first threshold (as set by a first threshold setting) and in the event that its input signal is below a threshold outputs a zero or null signal. Threshold pass 1356 outputs to convolution with window 1358. Convolution with window 1358 low pass filters its input using a convolution with a Tukey, Hamming, Hanning, or other appropriate window function. Convolution with window 1358 outputs to multiplier 1360. Multiplier 1360 multiplies the output of convolution with window 1358 by a squelch level setting value. This scales the squelching. In some embodiments, the squelch level setting value depends on a peak value so that squelching produces a substantially constant peak value for a peak after squelching. In various embodiments, the squelch level setting value is constant or a variable that reduces a peak value to enable efficient use of a power amplifier dynamic range.

Multiplier 1360 outputs to summing node 1362. Summing node 1362 subtracts the output of multiplier 1360 from '1' or another suitable constant value. Summing node 1362 outputs to multiplier 1364. Multiplier 1364 multiplies the output of summing node 1362 with the output of delay 1366. Delay 1366 outputs a delayed version of the input digital signal to the second stage. Delay 1366 is designed to delay the input signal so that the output signal of summing node 1362 is aligned in time with its corresponding signal for the input signal so that the multiplier squelches the appropriate portion (e.g., the peaks or crests) of the input signal to second stage. Multiplier 1364 outputs to summing node 1315. Summing node 1315 subtracts the output of delay 1316 from the output of multiplier 1364 to create an error signal. The error signal is the difference between the input signal and the multi-stage squelched signal. Summing node 1315 outputs to band-pass filter 1318. Band-pass filter 1318 removes distortion in frequency regions of the output signal from multiplier 1314 that are undesirable. For example, for power amplifier outputs that are supposed to conform to a standard for wired or wireless protocols distortion of signal energy in acceptable bands into bands neighboring the transmission bands may be specified (e.g., unacceptable). In various embodiments, band-pass filter 1318 comprises a finite impulse response filter, an infinite impulse response filter, a Butterworth, a Chebyshev, an elliptic, a Bessel, a Gaussian, or any other appropriate filter type. Band-pass filtering the error signal has reduced constraints because the desired input signal is not being filtered by the band-pass filter; Presumably, the input signal has the desired set of frequency and amplitude characteristics that are appropriate for the protocol being observed and, therefore, is not being distorted by the band-pass filter. Band-pass filter 1318 outputs to summing node 1320. Summing node 1320 adds the output of delay 1317 to the output of band-pass filter 1318. Delay 1317 is a delayed version of the signal output from delay 1316 (which in turn is a delayed version of the input signal to crest factor reducer 1300). Summing node 1320 produces a squelched version of the input signal by adding in a band-limited version of a squelching signal to the input signal. Summing node 1320 produces an output signal comprises the output of crest factor reducer 1300.

In some embodiments, threshold pass 1306 and 1356 passes amplitudes within a range of amplitudes (e.g., all peaks greater than x but less than y). In some embodiments, the multi-stages are in parallel instead of in series.

Figure 14:
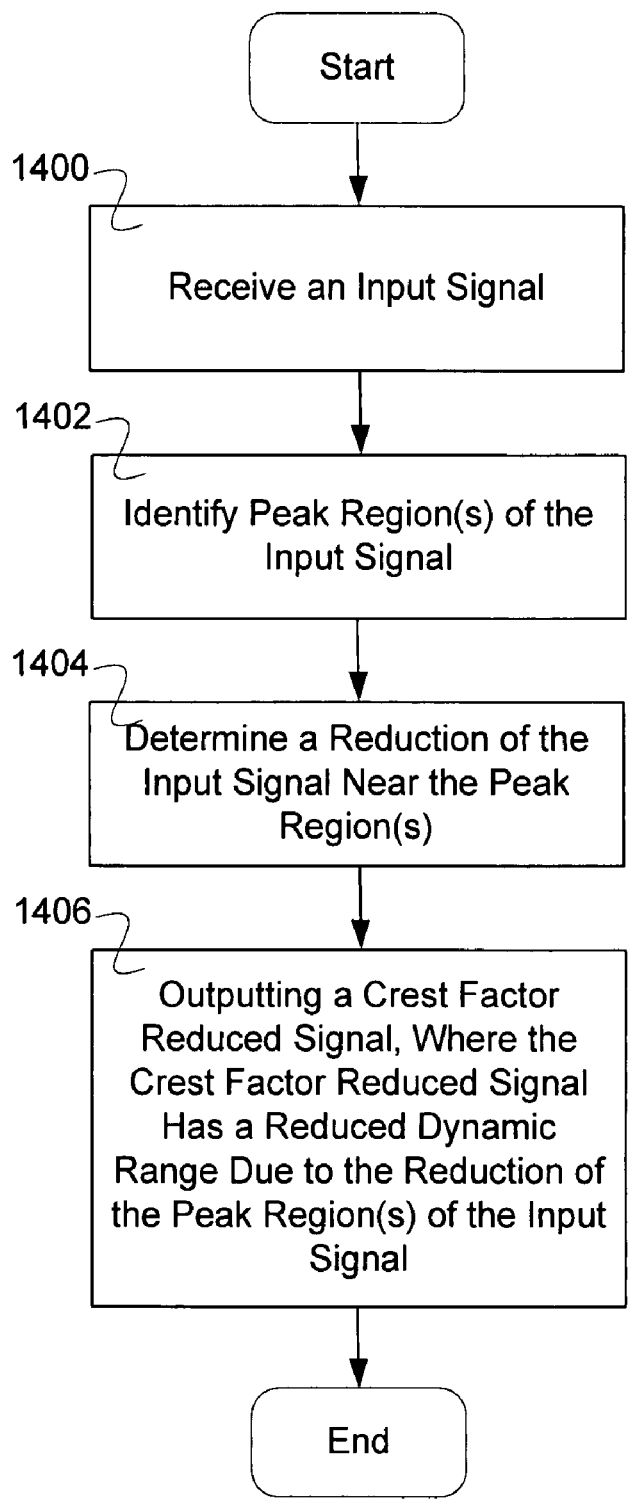
FIG. 14 is a flow diagram illustrating an embodiment of a process for crest factor reduction.

FIG. 14 is a flow diagram illustrating an embodiment of a process for crest factor reduction. In the example shown, in 1400 an input signal is received. In 1402, peak region(s) of the input signal are identified. In 1404, a reduction of the input signal near the peak region(s) is determined. In 1406, a crest factor output signal is reduced, where the crest factor reduced signal has reduced dynamic range due to the reduction of the peak region(s) of the input signal.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device for generating a crest factor reduced signal comprising:
    an interface configured to receive an input signal;
    a peak identifier configured to identify one or more peak regions of the input signal;
    a squelch level determiner configured to determine a reduction of the input signal near the one or more peak regions;
    a squelcher configured to reduce the one or more peak regions of the input signal as indicated by the squelch level determiner;
    an interface configured to output the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between a squelched signal from the squelcher and the input signal, band-pass filtering the difference to generate a result, and summing the result with an input signal that has been delayed, wherein the peak identifier comprises:

an absolute value processor configured to determine an absolute value of the input signal;

a window function filter configured to determine a smoothed absolute value of the input signal; and a threshold pass processor configured to identify the one or more peak regions by identifying regions where the smoothed absolute value of the input signal is above a threshold, to set a threshold pass output signal equal to a threshold pass input signal when the threshold pass input signal is above a predetermined threshold value, and to set the threshold pass output signal to zero when the threshold pass input signal is below the predetermined threshold value.

2. The device of claim 1, wherein the squelch level determiner comprises:

a convolution with window processor configured to determine a smooth curve from the one or more peak regions;

a multiplier configured to scale the smooth curve from the one or more peak regions by a scaling factor; and a summer configured to subtract from unity to determine a squelch level.

3. The device of claim 2, wherein the scaling factor comprises one or more of the following: a fixed value, a settable value, a user settable value, a value based at least in part on an amplitude of a peak in the input signal, or a value based at least in part on a statistic of the input signal.

4. The device of claim 2, wherein the convolution with window processor is configured to convolve with a Tukey window function, a Hamming window function, or a Hanning window function.

5. The device of claim 1, wherein the squelcher comprises:

a delay configured to delay the input signal; and a multiplier.

6. The device of claim 1, wherein the crest factor reduced signal is configured to be band pass filtered to reduce undesired frequency components.

7. The device of claim 1, wherein the window function filter uses a convolution with a Tukey window function, a Hamming window function, or a Hanning window function.

8. The device of claim 1, wherein the predetermined threshold value comprises one or more of the following: a value that is user settable, a value that is set based at least in part on a peak signal value, a value that is set based at least in part on a maximum peak signal value, or a value that is set based at least in part on a signal statistic.

9. The device of claim 1, wherein a stage comprises the peak identifier, the squelch level determiner, and the squelcher, and wherein there are a plurality of stages to enable squelching a first amplitude peak by a first stage and a second amplitude peak by a second stage.

10. A method for generating a crest factor reduced signal comprising:

receiving an input signal;

identifying one or more peak regions of the input signal;

determining a reduction of the input signal near the one or more peak regions;

outputting the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between an input signal with reduced peak regions and the input signal; band-pass filtering the difference to generate a result; and summing the result with an input signal that has been delayed, wherein the identifying one or more peak regions of the input signal comprises:

determining an absolute value of the input signal;

determining a smoothed absolute value of the input signal; and identifying the one or more peak regions by identifying regions where the smoothed absolute value of the input signal is above a threshold, setting a threshold pass output signal equal to a threshold pass input signal when the threshold pass input signal is above a predetermined threshold value, and setting the threshold pass output signal to zero when the threshold pass input signal is below the predetermined threshold value.

11. A computer program product for calculating a crest factor reduced signal, the computer program product being embodied in a non-transitory computer readable storage medium and comprising computer instructions for:

receiving an input signal;

identifying one or more peak regions of the input signal;

determining a reduction of the input signal near the one or more peak regions;

outputting the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between an input signal with reduced peak regions and the input signal; band-pass filtering the difference to generate a result; and summing the result with an input signal that has been delayed, wherein the identifying one or more peak regions of the input signal comprises:

determining an absolute value of the input signal;

determining a smoothed absolute value of the input signal; and identifying the one or more peak regions by identifying regions where the smoothed absolute value of the input signal is above a threshold, setting a threshold pass output signal equal to a threshold pass input signal when the threshold pass input signal is above a predetermined threshold value, and setting the threshold pass output signal to zero when the threshold pass input signal is below the predetermined threshold value.

12. A system for calculating a crest factor reduced signal comprising:

a processor; and a memory coupled with the processor, wherein the memory is configured to provide the processor with instructions which when executed cause the processor to:

receive an input signal;

identify one or more peak regions of the input signal;

determine a reduction of the input signal near the one or more peak regions;

output the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between an input signal with reduced peak regions and the input signal; band-pass filtering the difference to generate a result; and summing the result with an input signal that has been delayed, wherein to identify the one or more peak regions of the input signal, the processor is configured to:
determine an absolute value of the input signal;
determine a smoothed absolute value of the input signal; and
identify the one or more peak regions by identifying regions where the smoothed absolute value of the input signal is above a threshold, to set a threshold pass output signal equal to a threshold pass input signal when the threshold pass input signal is above a predetermined threshold value, and to set the threshold pass output signal to zero when the threshold pass input signal is below the predetermined threshold value.

13. A device for generating a crest factor reduced signal comprising:
an interface configured to receive an input signal;
a peak identifier configured to identify one or more peak regions of the input signal;
a squelch level determiner configured to determine a reduction of the input signal near the one or more peak regions;
a squelcher configured to reduce the one or more peak regions of the input signal as indicated by the squelch level determiner;
an interface configured to output the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between a squelched signal from the squelcher and the input signal, band-pass filtering the difference to generate a result, and summing the result with an input signal that has been delayed, wherein
the squelch level determiner comprises:
a convolution with window processor configured to determine a smooth curve from the one or more peak regions;
a multiplier configured to scale the smooth curve from the one or more peak regions by a scaling factor, wherein the scaling factor comprises one or more of the following: a fixed value, a settable value, a user settable value, a value based at least in part on an amplitude of a peak in the input signal, or a value based at least in part on a statistic of the input signal; and
a summer configured to subtract from unity to determine a squelch level.

14. The device of claim 13, wherein the peak identifier comprises:
an absolute value processor configured to determine an absolute value of the input signal;
a window function filter configured to determine a smoothed absolute value of the input signal; and
a threshold pass processor configured to identify the one or more peak regions by identifying regions where the smoothed absolute value of the input signal is above a threshold.

15. The device of claim 14, wherein the window function filter is configured to use a convolution with a Tukey window function, a Hamming window function, or a Hanning window function.

16. The device of claim 14, wherein the threshold pass processor is configured to set a threshold pass output signal equal to a threshold pass input signal when the threshold pass input signal is above a predetermined threshold value, and to set the threshold pass output signal to zero when the threshold pass input signal is below the predetermined threshold value.

17. The device of claim 16, wherein the predetermined threshold value comprises a value that is user settable, a value that is set based at least in part on a peak signal value, a value that is set based at least in part on a maximum peak signal value, or a value that is set based at least in part on a signal statistic.

18. The device of claim 13, wherein the squelcher comprises:
a delay configured to delay the input signal; and
a multiplier.

19. The device of claim 13, wherein the crest factor reduced signal has been band pass filtered to reduce undesired frequency components.

20. The device of claim 13, wherein the convolution with window processor is configured to convolve with a Tukey window function, a Hamming window function, or a Hanning window function.

21. The device of claim 13, wherein a stage comprises the peak identifier, the squelch level determiner, and the squelcher, and wherein there are a plurality of stages to enable squelching a first amplitude peak by a first stage and a second amplitude peak by a second stage.

22. A method for generating a crest factor reduced signal comprising:
receiving an input signal;
identifying one or more peak regions of the input signal;
determining a reduction of the input signal near the one or more peak regions;
outputting the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between an input signal with reduced peak regions and the input signal; band-pass filtering the difference to generate a result; and summing the result with an input signal that has been delayed, wherein
the determining a reduction of the input signal near the one or more peak regions comprises:
determining a smooth curve from the one or more peak regions;
scaling the smooth curve from the one or more peak regions by a scaling factor, wherein the scaling factor comprises one or more of the following: a fixed value, a settable value, a user settable value, a value based at least in part on an amplitude of a peak in the input signal, or a value based at least in part on a statistic of the input signal; and
subtracting from unity to determine a squelch level.

23. A computer program product for calculating a crest factor reduced signal, the computer program product being embodied in a computer readable storage medium and comprising computer instructions for:
receiving an input signal;
identifying one or more peak regions of the input signal;
determining a reduction of the input signal near the one or more peak regions;
outputting the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between an input signal with reduced peak regions and the input signal; band-pass filtering the difference to generate a result; and summing the result with an input signal that has been delayed, wherein the determining a reduction of the input signal near the one or more peak regions comprises:

determining a smooth curve from the one or more peak regions;

scaling the smooth curve from the one or more peak regions by a scaling factor, wherein the scaling factor comprises one or more of the following: a fixed value, a settable value, a user settable value, a value based at least in part on an amplitude of a peak in the input signal, or a value based at least in part on a statistic of the input signal; and subtracting from unity to determine a squelch level.

24. A system for calculating a crest factor reduced signal comprising:

a processor; and a memory coupled with the processor, wherein the memory is configured to provide the processor with instructions which when executed cause the processor to:

receive an input signal;

identify one or more peak regions of the input signal;

determine a reduction of the input signal near the one or more peak regions;

output the crest factor reduced signal, wherein the crest factor reduced signal has a reduced dynamic range due to the reduction of the one or more peak regions of the input signal, the crest factor reduced signal has been filtered to reduce undesired frequency components by: calculating a difference between an input signal with reduced peak regions and the input signal; band-pass filtering the difference to generate a result; and summing the result with an input signal that has been delayed, wherein to determine a reduction of the input signal near the one or more peak regions, the processor is configured to:

determine a smooth curve from the one or more peak regions;

scale the smooth curve from the one or more peak regions by a scaling factor, wherein the scaling factor comprises one or more of the following: a fixed value, a settable value, a user settable value, a value based at least in part on an amplitude of a peak in the input signal, or a value based at least in part on a statistic of the input signal; and subtract from unity to determine a squelch level.

\* \* \* \* \*